United States Patent [19]

Pardee

[11] Patent Number: 4,661,679

[45] Date of Patent: Apr. 28, 1987

[54] SEMICONDUCTOR LASER PROCESSING WITH MIRROR MASK

[75] Inventor: John B. Pardee, Milwaukee, Wis.

[73] Assignee: Eaton Corporation, Cleveland, Ohio

[21] Appl. No.: 750,406

[22] Filed: Jun. 28, 1985

[51] Int. Cl.[4] .............................................. B23K 26/00
[52] U.S. Cl. ........................... 219/121 L; 219/121 LQ; 219/121 FS; 427/53.1
[58] Field of Search .... 219/121 L, 121 LM, 121 LA, 219/121 LH, 121 LJ, 121 LP, 121 LQ, 121 FS, 121 LE, 121 LF; 427/53.1; 148/1.5

[56] References Cited

U.S. PATENT DOCUMENTS

| | | | |
|---|---|---|---|
| 3,986,767 | 10/1976 | Rexer et al. | 219/121 LQ X |
| 4,135,902 | 1/1979 | Oehrle | 219/121 LF X |
| 4,156,124 | 5/1979 | Macken et al. | 219/121 LH |
| 4,370,175 | 1/1983 | Levatter | 427/53.1 X |
| 4,480,169 | 10/1984 | Macken | 219/121 LQ X |
| 4,495,218 | 1/1985 | Azuma et al. | 427/53.1 X |
| 4,505,949 | 3/1985 | Jelks | 427/38 |
| 4,532,401 | 7/1985 | Shiozaki et al. | 219/121 LH |

FOREIGN PATENT DOCUMENTS

| | | | |
|---|---|---|---|
| 0032497 | 3/1978 | Japan | 219/121 LQ |
| 0006786 | 1/1983 | Japan | 219/121 LQ |
| 0184080 | 10/1983 | Japan | 219/121 LQ |

Primary Examiner—C. L. Albritton
Attorney, Agent, or Firm—Andrus, Sceales, Starke & Sawall

[57] ABSTRACT

A semiconductor processing technique is provided for reacting with the surface (2) of a semiconductor wafer substrate (4) only along a predetermined pattern without a pass-through mask. Excimer pulsed ultraviolet laser radiation (32) is reflected by a mirror (10) having a selective pattern (12) thereon to direct laser radiation only along a predetermined pattern onto the substrate surface (2) as determined by the selective mirror pattern (12), to selectively activate designated areas of the substrate (4). There is further provided a method for forming a predetermined pattern on a cylindrical target (76) by directing excimer pulsed ultraviolet laser radiation (74) along the conical axis of a conical mirror (72) having a selective pattern thereon.

1 Claim, 6 Drawing Figures

4,661,679

SEMICONDUCTOR LASER PROCESSING WITH MIRROR MASK

BACKGROUND AND SUMMARY

The present invention provides a semiconductor processing technique for selectively reacting with and activating designated surface areas of a semiconductor substrate in a predetermined lithography pattern without a pass-through mask. The invention further relates to laser processing techniques for forming a predetermined pattern on a nonplanar target, including a cylindrical target.

Microelectronic device fabrication technology is increasingly demanding more sophisticated semiconductor processing techniques, and material formation with more accurate and reliably controlled material characteristics even down to interatomic bonding and crystalline lattice structure. Conventional thermal processing and masking techniques may not be adequate because of the distortion of the wafer and/or mask due to incident energy induced heating.

DETAILED DESCRIPTION

Figure 1:
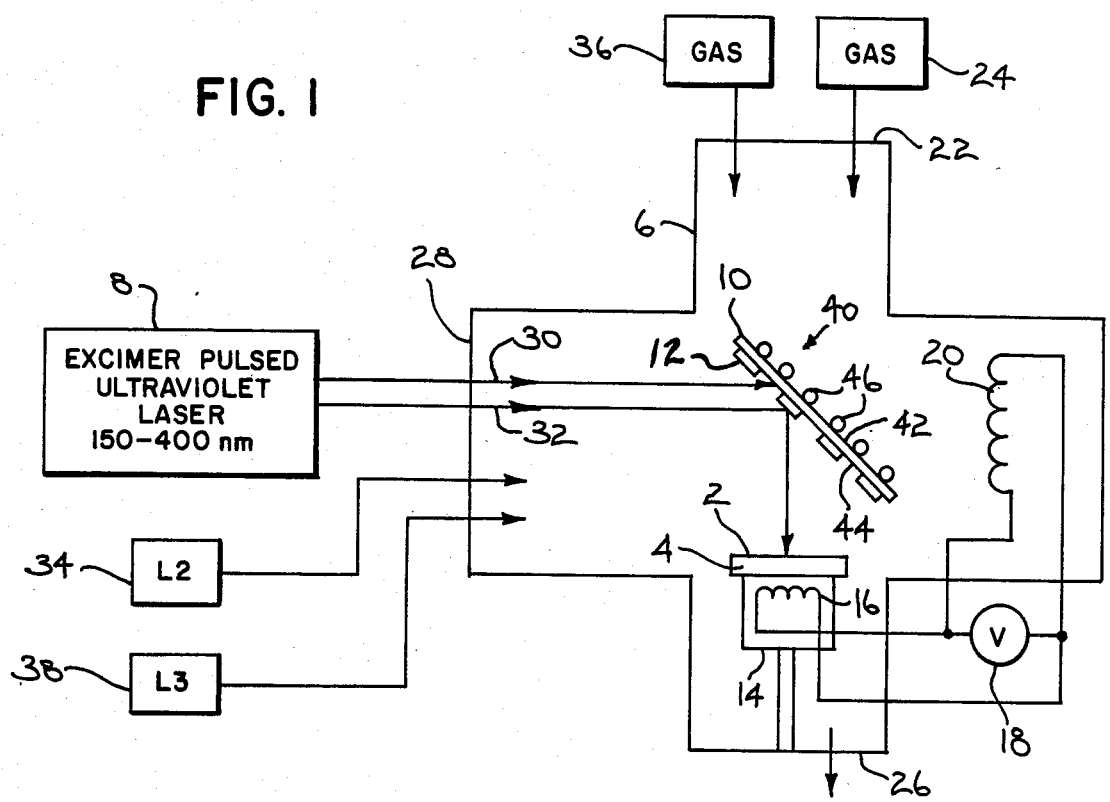
FIG. 1 illustrates the semiconductor processing technique in accordance with the invention.

The present invention provides a semiconductor processing technique for reacting with the surface 2 of a semiconductor wafer substrate 4 in chamber 6 only along a predetermined pattern, without a pass-through mask. Excimer pulsed ultraviolet laser radiation from laser 8 irradiates mirror 10 having a selective pattern 12 thereon and reflecting the incident radiation onto substrate 4 only along a predetermined pattern on surface 2 determined by the selective mirror pattern 12, to selectively activate designated areas of substrate 4.

In the embodiment shown in FIG. 1, semiconductor wafer substrate 4 is placed in a conventional deposition processing chamber 6 having a pedestal 14 for supporting wafer 4. Conventional processing chambers typically include a resistance coil heater 16 or the like at the pedestal supplied by a voltage source 18 for heating wafer substrate 4 and/or a resistance coil 20 for heating the interior of chamber 6. These thermal processing elements are optional in the present system. Gas may be introduced into the chamber at port 22 from gas supply 24, and may be exhausted at port 26, all as is conventional. Chamber 6 includes an observation window or port 28. Excimer pulsed ultraviolet laser radiation from laser 8 is introduced through port 28 and directed by mirror 10 and its selective pattern 12 to impinge surface 2 of wafer substrate 4 to selectively activate designated areas of same along a predetermined pattern.

Figure 2:
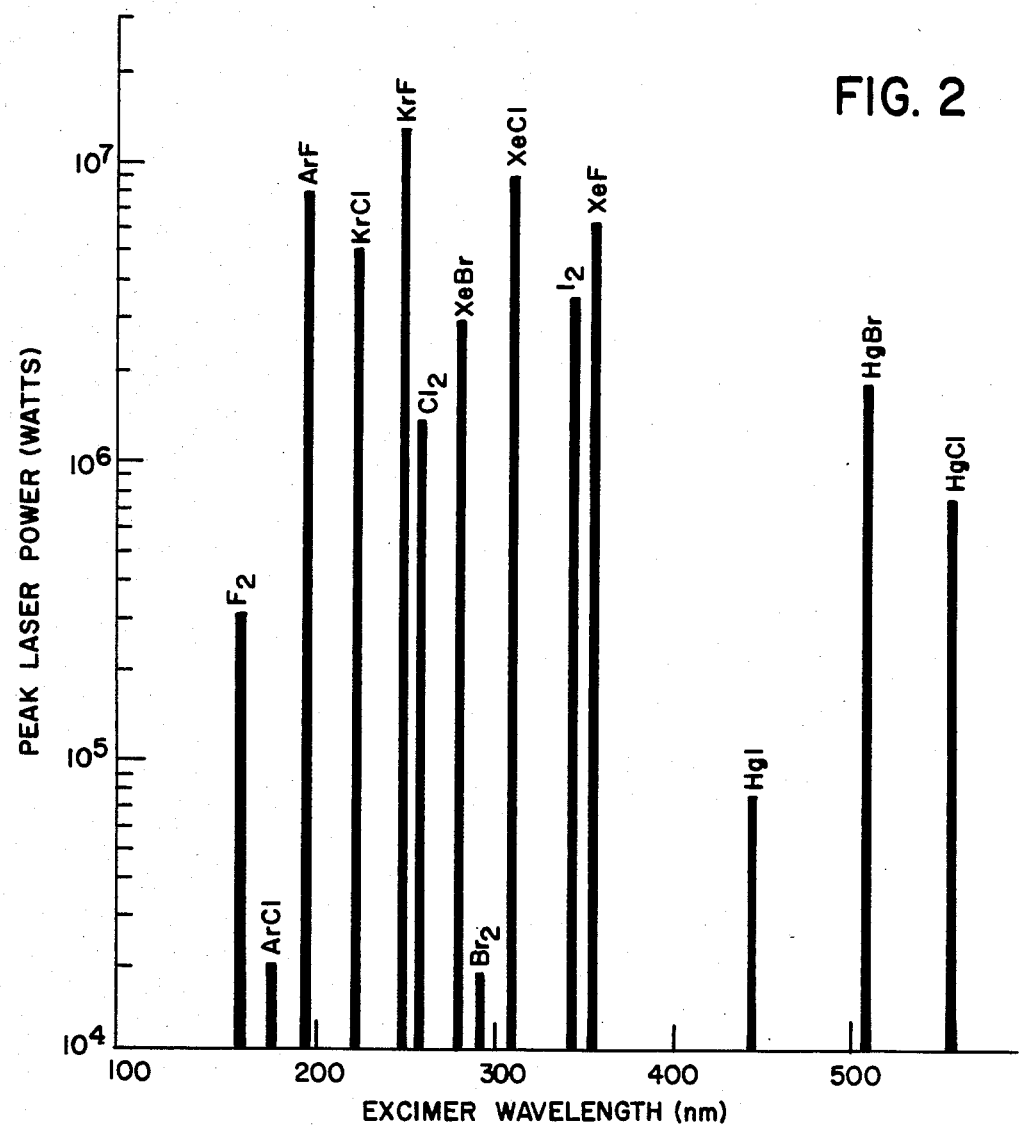
FIG. 2 illustrates various available excimer pulsed ultraviolet laser radiation wavelengths and peak power.

FIG. 2 shows various available excimer pulsed ultraviolet laser radiation wavelengths and peak power. At these wavelengths, various interactions are effected with surface 2 according to the excitation energy. In one embodiment, at the discrete excitation energy corresponding to the designated wavelength, the surface atomic bonds of substrate 4 are photolytically broken and cleaved to create dangling bonds, without pyrolytic thermal processing. The excimer wavelength is chosen according to the substrate material and its absorption spectrum, or vice versa.

The present invention provides an alternative to the maskless pattern formation disclosed in copending application Ser. No. 06/737,223, filed May 22, 1985. In the referenced application, the number of nucleation and bonding sites is selectively increased at localized selected portions of the surface, as an alternative to masking. Dangling bonds are created only where one wants to later deposit silicon. The narrow spectral output of the excimer pulsed ultraviolet laser enables highly specific electronic excitation of bonding sites at highly localized areas and excitation energies, driving a predetermined controllable reaction. In the referenced application, the laser beam is focused tightly down to a fine spot, for example a micron in width or less, and used to write a line or pattern of dangling bond nucleation sites on the substrate surface, at which sites later deposited silicon will bond and nucleate to match the corresponding pattern, without a mask. The activation of the substrate selectively enables later silicon absorption thereinto in a designated pattern. The substrate surface is irradiated with excimer pulsed ultraviolet laser radiation at a discrete designated wavelength at selective localized areas resonantly reacting with and activating the substrate to resonantly photolytically cleave surface atomic bonds and create dangling bonds at the selective areas to locally increase surface reactivity by creating more nucleation and bonding sites to strongly couple with and absorb incoming material along the given pattern of selective localization.

In the present invention, instead of focusing the excimer pulsed ultraviolet laser radiation beam and/or using a pass-through mask, there is instead provided a mirror 10 with a selective excimer pulsed ultraviolet laser radiation reflection directing pattern 12 thereon. The mirror is irradiated with excimer pulsed ultraviolet laser radiation as at 30 and 32 at a discrete designated wavelength to reflectingly direct the radiation to photolytically activate and react with substrate surface atomic bonds at selective areas forming the predetermined pattern on surface 2 to locally increase surface reactivity by creating more nucleation and bonding sites to strongly couple with and absorb material along the predetermined pattern of selective localization. Incident ray 30 strikes an anti-reflective portion of mirror 10 and is absorbed thereinto, or is reflected away from substrate 4. Incident ray 32 strikes a laser-reflective portion of pattern 12 and is reflected to substrate 4. The pattern 12 on mirror 10 is enlarged for illustration purposes.

In one embodiment, wafer substrate 4 is silicon and is irradiated with reflected excimer pulsed ultraviolet laser radiation at a discrete designated wavelength at selective localized areas resonantly reacting with and activating silicon substrate 4 at surface 2 to resonantly photolytically cleave surface atomic bonds and create dangling bonds at selective areas to locally increase surface reactivity by creating more nucleation and bonding sites to strongly couple with and absorb later or concurrently deposited material along the given pattern of selective localization. Silicon may be the material deposited on the wafer to strongly couple and bond at the localized activated surface areas of the substrate. For example, silicon-containing gas such as silane $SiH_4$ is introduced from source 24 into chamber 6, and excimer pulsed ultraviolet laser radiation, for example from a second excimer laser source 34, or a second wavelength from laser 8, is introduced into the chamber to photochemically break bonds of the silicon-containing gas at a designated wavelength to grow single crystalline silicon on substrate surface 2, without thermally driven pyrolytic deposition. The single crystalline silicon is deposited at a discrete wavelength of the excimer pulsed ultraviolet laser radiation corresponding to a discrete excitation energy photochemically breaking bonds in the gas providing uniform nucleation and crystallization to single crystalline silicon, with the dangling bonds created by laser 8 significantly enhancing bonding and single crystalline formation and growth. The dangling bond creation and single crystalline deposition are carried out at a temperature ranging from room temperature to about 400° C., which is significantly below typical thermal processing temperatures of 1,000° C. The silicon-containing dopant gas is preferably selected from the group consisting of silane, disilane and silicon alkyl.

In a further form, chamber 6 is provided with a gaseous mixture including silicon-containing gas from source 24 and also a scavenger gas from source 36. The scavenger gas is irradiated with excimer pulsed ultraviolet laser radiation, for example from third excimer laser source 38, or another wavelength from laser 8, to photolytically activate the scavenger gas and release scavenging agents to remove surface contaminants from substrate 4, to enable subsequent or concurrent in-situ uniform epitaxial growth of single crystalline silicon or enable deposition of other material along the predetermined pattern. The scavenger gas is preferably selected from the group consisting of nitrogen dioxide and carbon tetrafluoride and photolytically reacts with excimer laser radiation from laser 38 to produce scavenging radicals, ions or neutrals. The scavenger gas from source 36 and the silicon-containing gas from source 24 are preferably benign relative to each other and activated at different excimer pulsed ultraviolet laser radiation wavelengths and at different wavelengths than selective pattern activation of surface 2, such as dangling bond formation or the like. It is preferred that three different excimer pulsed ultraviolet laser radiation wavelengths be used, either from three different sources 8, 34 and 38, or from a single source 8, though various alternatives are possible, with dangling bond formation or other localized surface area activation of surface 2, silicon or other material deposition, and scavenging, all reacting to the same wavelength, or various pairs and combinations. In other alternatives, the laser radiation can react with the scavenger and/or silicon-containing gas without impinging the substrate.

The surface of a semiconductor wafer substrate tends to be planar, uniform and interconnected. In order for subsequent processing techniques to react, it is desirable to increase the surface reactivity and break away various atoms fom neighboring units and provide more free bonding sites, for example to react with and absorb new incoming dopant or other material in a further processing step and enhance bonding therewith. In the present invention, the population of free bonding sites is selectively increased along a predetermined pattern determined by the laser-reflective pattern 12 on mirror 10. In the noted one form, the population of dangling bonds in the natural state is selectively increased along the predetermined pattern by resonantly reacting with the substrate either before or during a processing or dopant deposition step. This resonant reaction is carried out photolytically, without pyrolytic thermal reaction. In other forms, the impinging laser radiation on surface 2 activates the substrate by removing surface contaminants therefrom along the predetermined pattern, for later or concurrent bonding with dopant material along the predetermined decontaminated pattern.

Figure 3:
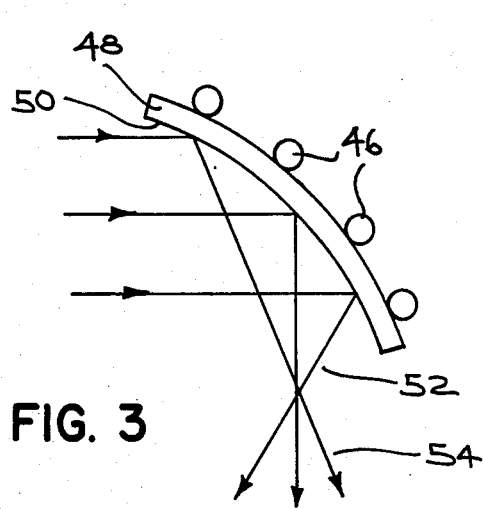
FIG. 3 illustrates an alternate embodiment of the mirror of FIG. 1.
Figure 4:
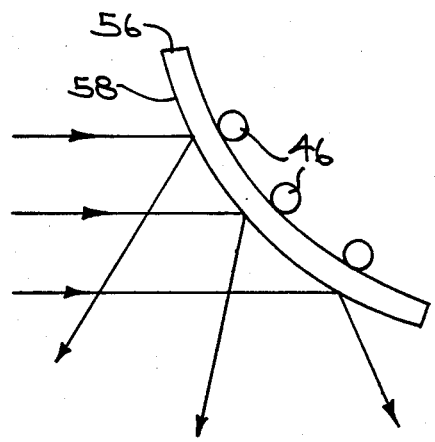
FIG. 4 illustrates another alternate embodiment of the mirror of FIG. 1.

Mirror 10 is cooled with cooling means 40 on the backside 42 thereof opposite the incident side 44 of excimer pulsed ultraviolet laser radiation. Cooling means 40 may be provided in a variety of manners, as by a heat sink or by liquid or pressurized gas supplied through cooling tubes 46 in or adjacent the mirror substrate. FIG. 3 shows an alternate embodiment mirror 48 with a nonplanar concave curved reflecting surface 50 for reflecting the incident radiation and demagnifying the predetermined pattern if the target or substrate 4 is placed at position 52, and magnifying the predetermined pattern if the target or substrate 4 is placed at position 54. FIG. 4 shows another alternate embodiment mirror 56 with a nonplanar convex curved reflecting surface 58 magnifying the predetermined pattern.

Figure 5:
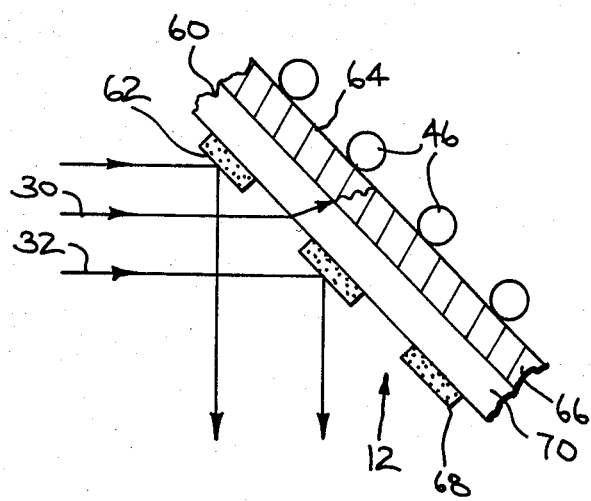
FIG. 5 illustrates a further alternate embodiment of the mirror of FIG. 1.

FIG. 5 shows a further alternate embodiment mirror 60 including a front side 62 reflecting incident excimer pulsed ultraviolet laser radiation along the predetermined pattern, and a back side 64 disposed oppositely from front side 62, and including the noted cooling means provided by cooling tubes 46 for cooling back side 64. Cooling tubes 46 cool the mirror without interferring with radiation transmitted to wafer substrate 4. Mirror 60 includes a laser-absorbing medium 66 having cooling tubes 46 adjacent thereto. Mirror 60 includes a laser-reflective medium 68 having the noted selective pattern 12 of FIG. 1 formed thereon. Mirror 60 further includes a laser-transparent medium 70 between laser-absorbing medium 66 and laser-reflective medium 68. Incident ray 30 is refracted into laser-transparent medium 70 and absorbed in laser-absorbing medium 66. Incident ray 32 is reflected by laser-reflective medium 68 in the noted selective pattern. The selective pattern 12 of laser-reflective material 68 on the front side of the mirror is provided by depositing laser-reflective material on the mirror along the selective pattern. Alternatively, laser-reflective material may be deposited across the entire front side surface of the mirror and then selectively removed as by etching to leave the selective pattern of laser-reflective material. Alternatively, the selective pattern may be provided by depositing laser anti-reflective material on the front side of the mirror along a pattern leaving the mirror exposed along the selective reflective pattern. As a further alternative, the selective pattern may be provided by depositing laser anti-reflective material on the mirror and selectively removing the laser anti-reflective material, leaving the mirror exposed along the selective pattern.

The mirror-masking and excimer pulsed ultraviolet laser radiation combination of the invention facilitates a simple, easily cooled and stable mask medium for patterning. Unlike conventional pass-through masks that can suffer from distortion due to incident energy induced heating, the mask mirror can employ back side cooling to control the surface temperature. These cooling techniques are difficult to use in pass-through masks because the cooling tubes interfere with the desired pattern. The invention facilitates various excimer pulsed ultraviolet laser processing steps where selective area coverage is desired, particularly those applications where masking or focusing is preferred for activating only certain areas of the wafer. The embodiment in FIG. 5 is particularly desirable because it removes the heat dissipating ultraviolet absorbing medium 66 from the immediate vicinity of the reflective medium 68, thus providing improved isolation from temperature induced size changes. This arrangement further separates the cooling means, such as tubes 46 or a heat sink, from the reflective surface.

The invention further faciliates ease of magnification or demagnification of an image by changing the radius of curvature of the mirror surface. Nonspherical surface geometries can correct for reflection angle distortions.

Figure 6:
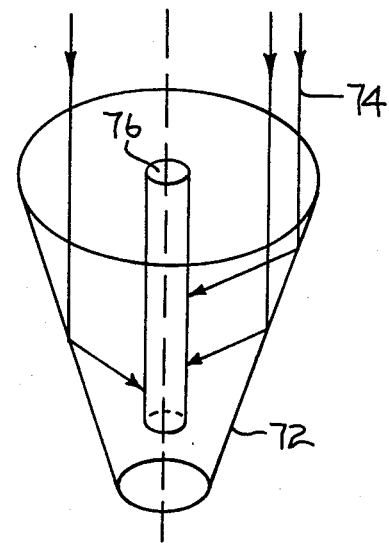
FIG. 6 illustrates a laser processing technique in accordance with the invention.

The mirror masking technique of the invention is also amenable to forming a predetermined pattern on a nonplanar target, including a cylindrical target. Referring to FIG. 6, a nonplanar mirror 72 is provided with a selective pattern thereon and is irradiated with excimer pulsed ultraviolet laser radiation at 74 to reflect same onto target 76 along the predetermined pattern as determined by the selective mirror pattern. In the embodiment in FIG. 6, the mirror is conical and the incident excimer pulsed ultraviolet laser radiation 74 is directed along the conical axis of the mirror. The target 76 may be a cylindrical member along the conical axis.

It is recognized that various alternatives and modifications are possible within the scope of the appended claims.

I claim:

1. Apparatus for fabricating a semiconductor comprising:
   a chamber;
   means for supporting said semiconductor within said chamber;
   means for introducing excimer pulsed ultraviolet laser radiation into said chamber; and
   mirror means for reflecting incident said excimer pulsed ultraviolet laser radiation onto said semiconductor at selective localized areas forming a predetermined pattern according to a selective mirror reflective pattern, to selectively activate designated areas of said semiconductor;
   wherein said mirror means comprises a front side reflecting said incident excimer pulsed ultraviolet laser radiation along said predetermined pattern, and a backside disposed oppositely from said front side, and comprising means for cooling said backside; and
   wherein said mirror means comprises a laser-absorbing medium and a laser-reflective medium, said laser-absorbing medium having said cooling means adjacent thereto, and said laser-reflective medium having said selective reflective pattern formed thereon; and
   comprising a laser-transparent medium between said laser-absorbing medium and said laser-reflective medium.

* * * * *